(12) United States Patent
Yang et al.

(10) Patent No.: US 6,787,906 B1
(45) Date of Patent: Sep. 7, 2004

(54) BIT LINE PAD AND BORDERLESS CONTACT ON BIT LINE STUD WITH LOCALIZED ETCH STOP LAYER FORMED IN AN UNDERMINED REGION

(75) Inventors: Won-Suk Yang, Yongin (KR); Sang-Ho Song, Seoul (KR); Hong-Sik Jeong, Suwon (KR); Ki-Nam Kim, Anyang (KR)

(73) Assignee: Samsung Electronics Co., Ltd. (KR)

( * ) Notice: Subject to any disclaimer, the term of this patent is extended or adjusted under 35 U.S.C. 154(b) by 484 days.

(21) Appl. No.: 09/699,589

(22) Filed: Oct. 30, 2000

(51) Int. Cl.⁷ .................. H01L 23/48; H01L 23/52; H01L 29/40
(52) U.S. Cl. ....................... 257/758; 257/774
(58) Field of Search ................. 257/758, 774

(56) References Cited

U.S. PATENT DOCUMENTS

| | | | |
|---|---|---|---|
| 4,966,870 A | 10/1990 | Barber et al. | 437/228 |
| 5,466,636 A | 11/1995 | Cronin et al. | 437/187 |
| 5,612,254 A | 3/1997 | Mu et al. | 437/195 |
| 5,661,344 A * | 8/1997 | Havemann et al. | 257/758 |
| 5,726,499 A * | 3/1998 | Irinoda | 257/774 |
| 5,808,335 A | 9/1998 | Sung | 257/306 |
| 5,891,799 A | 4/1999 | Tsui | 438/624 |
| 5,895,239 A | 4/1999 | Jeng et al. | 438/239 |
| 5,918,120 A | 6/1999 | Huang | 438/239 |
| 6,022,776 A | 2/2000 | Lien et al. | 438/253 |
| 6,083,824 A | 7/2000 | Tsai et al. | 438/629 |
| 6,221,713 B1 * | 4/2001 | Huang | 438/241 |
| 6,350,649 B1 * | 2/2002 | Jeong et al. | 438/256 |
| 6,380,071 B1 * | 4/2002 | Onuma | 438/634 |
| 6,492,730 B1 * | 12/2002 | Nakamura et al. | 257/758 |
| 6,518,671 B1 * | 2/2003 | Yang et al. | 257/758 |

OTHER PUBLICATIONS

"Impact of passivation film deposition and post–annealing on the reliability of flash memories," Shuto et al., 1997 ICEE International Realiability Physics Symposium Proceedings (35th Annual), pp. 17–24.

* cited by examiner

Primary Examiner—Howard Weiss
(74) Attorney, Agent, or Firm—Mills & Onello, LLP

(57) ABSTRACT

An etch-stop layer is selectively provided between layers of a multiple-layered circuit in a selective manner so as to allow for outgassing of impurities during subsequent fabrication processes. The etch-stop layer is formed over an underlying stud so as to serve as an alignment target during formation of an overlying stud formed in an upper layer. In this manner multiple-layered circuits, for example memory devices, can be fabricated in relatively dense configurations.

11 Claims, 9 Drawing Sheets

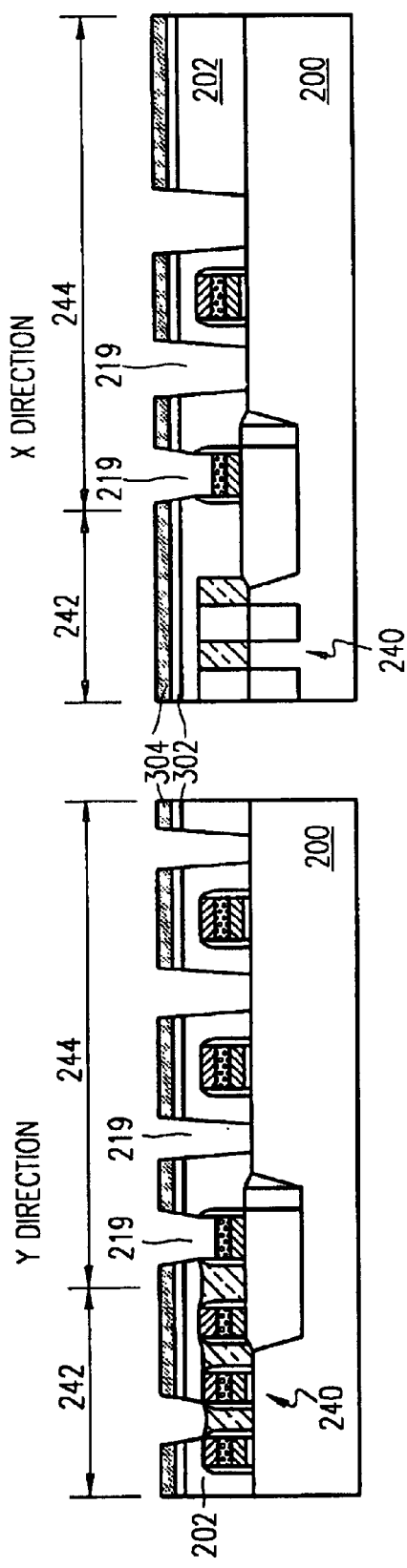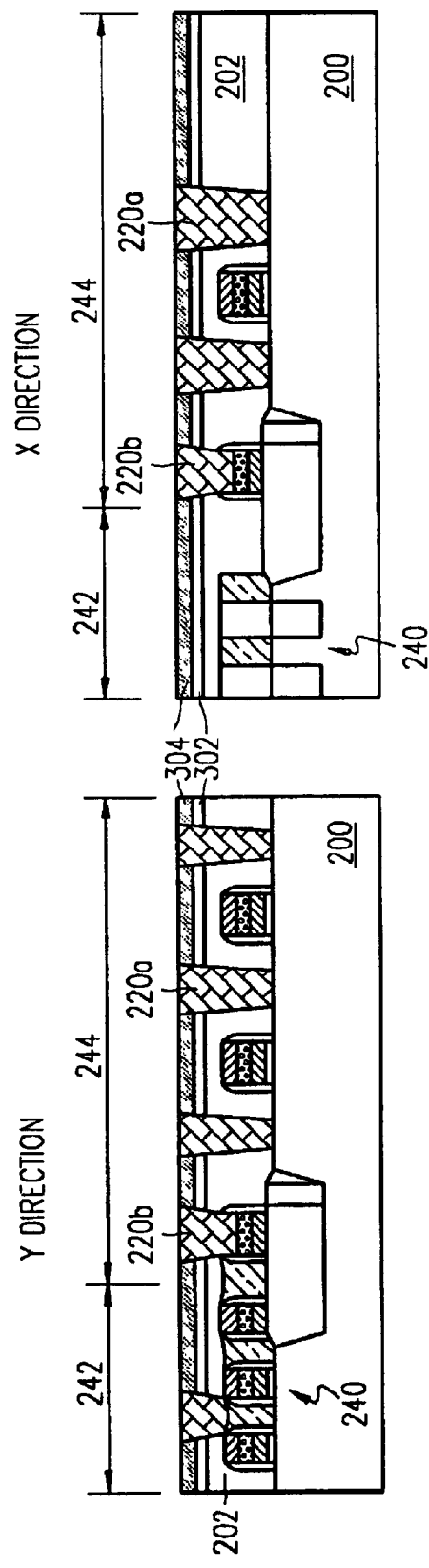
FIG. 3a
FIG. 3b

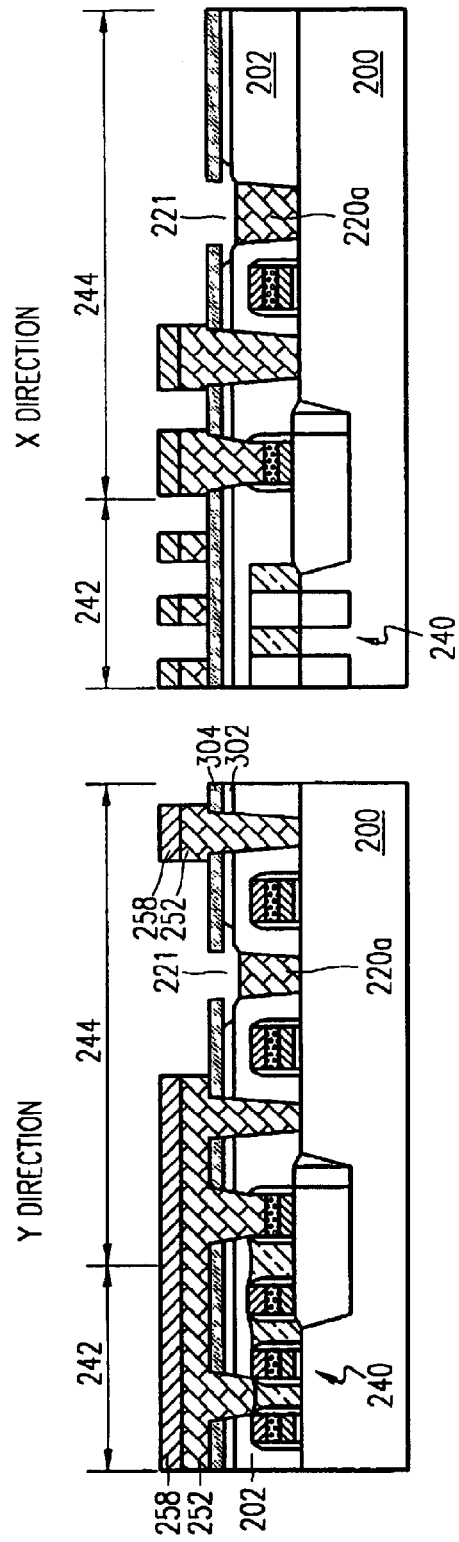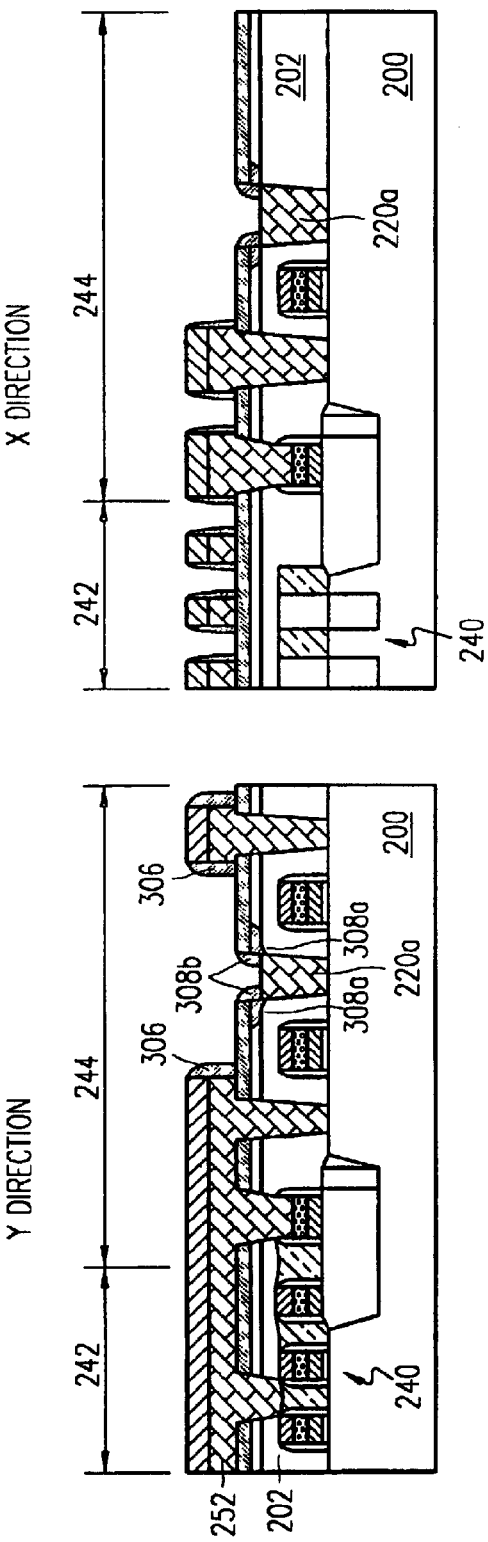
FIG. 3c
FIG. 3d

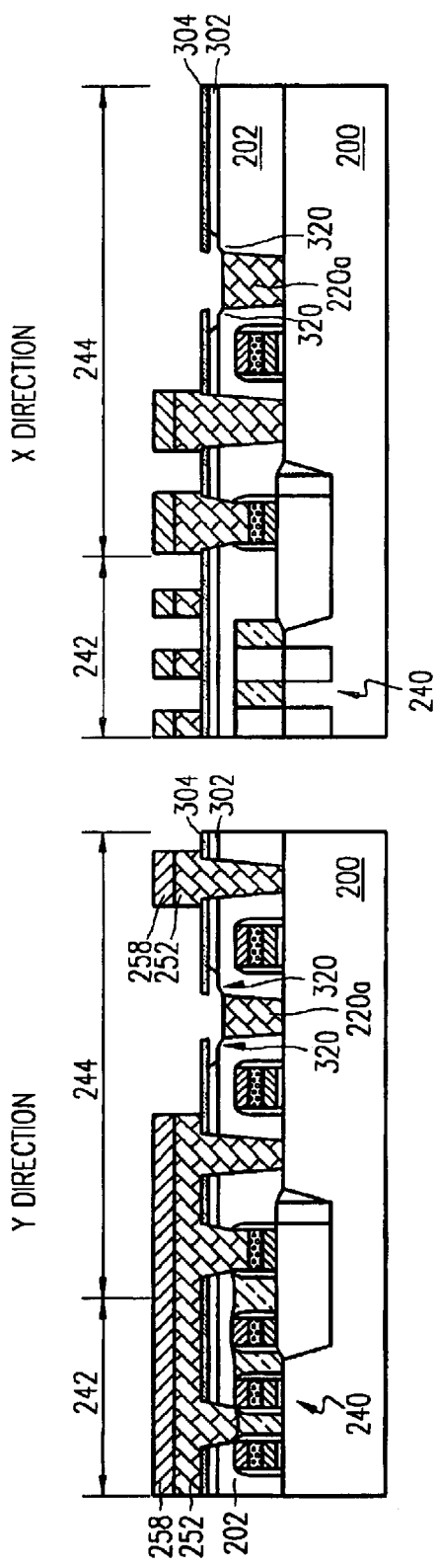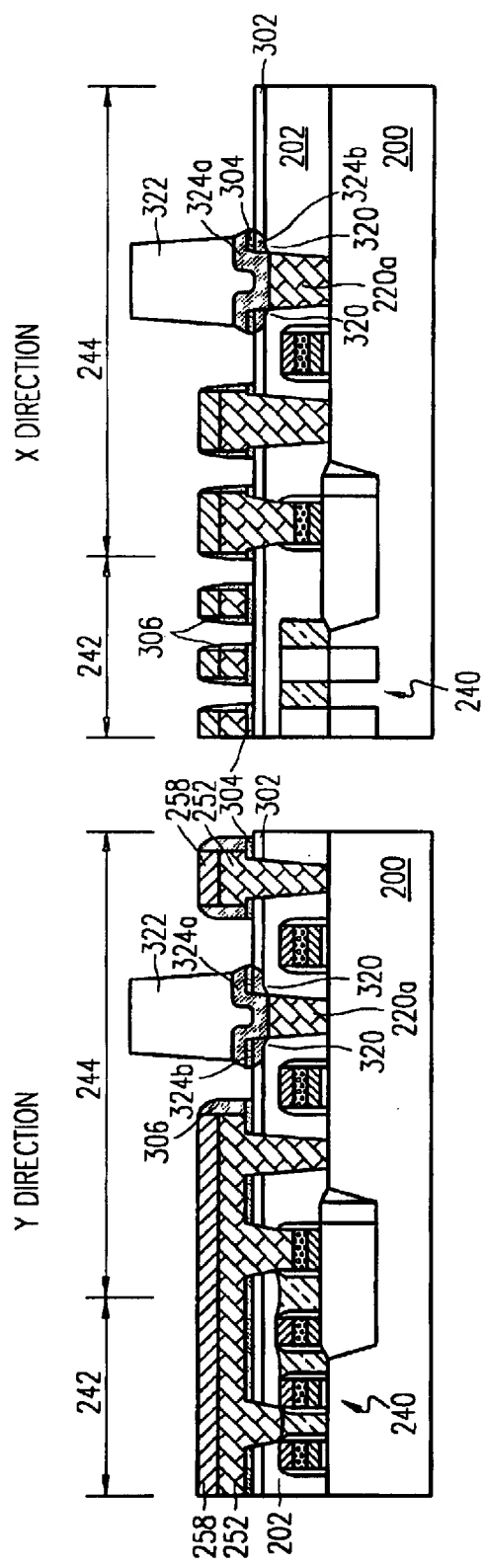

BIT LINE PAD AND BORDERLESS CONTACT ON BIT LINE STUD WITH LOCALIZED ETCH STOP LAYER FORMED IN AN UNDERMINED REGION

RELATED APPLICATIONS

The present application is related to U.S. Ser. No. 09/699,849, entitled "Bit Line Landing Pad and Borderless Contact on Bit Line Stud with Etch Stop Layer and Manufacturing Method Thereof", filed of even date herewith, now U.S. Pat. No. 6,350,649; and U.S. Ser. No. 09/699,591, entitled "Bit Line Landing Pad and Borderless Contact on Bit Line Stud with Localized Etch Stop Layer and Manufacturing Method Thereof", filed of even date herewith, now U.S. Pat. No. 6,518,671 and incorporated herein by reference.

BACKGROUND OF THE INVENTION

In order to make more efficient use of integrated circuit surface area, conventional two-dimensional semiconductor technology has evolved such that contemporary circuits are formed on multiple layers in a three-dimensional configuration. In such configurations, active devices and interconnects are formed in a layered relationship. During the formation of each subsequent layer, an inter-layer pathway, referred to in the art as a "plug", or "stud" is electrically coupled between the various active devices and transmission lines of the different layers. To assist in aligning a plug, "landing pads" or "taps" are formed in lower layers to serve as a target for the plugs passing from the upper layer. The landing pads are coupled to an underlying circuit or interconnect and are generally larger in surface area than the circuit or interconnect to serve as a wider-tolerance target for the plug.

Such multi-layered technology has enabled the design of highly-integrated memory devices, for example DRAM devices, having extremely high capacity, for example above 1 gigabyte. Such DRAM devices include multiple arrays of memory cells, densely and efficiently laid out under tight design constraints. Between the cell areas are peripheral regions, which include supporting circuitry and interconnect circuitry between the cells, as well as input/peripherals, and the like.

Any misalignment between the vertical plugs and the horizontal interconnect features can cause defects and reliability problems. To ensure that the plug aligns with a feature, the features are made larger than required, for example through the use of landing pads. The area by which the feature is made larger is referred to in the art as a "border" around the vertical contact hole. Any excessive border area thus has a negative impact on circuit density.

Attempts have been made in the past to provide multiple layer interconnect, while reducing or eliminating the border area. These include circuits and fabrication procedures disclosed in U.S. Pat. Nos. 6,083,824, 5,612,254, and 4,966,870.

To a larger extent, the packing density of circuits is limited by how closely the interconnect metal between circuits can be formed without encroaching on each other. These limits are dictated by design rules that govern the separation of one level of contact from another, and by design rules for nesting tolerance or for borders used around contacts.

Other efforts have made toward reducing the high-aspect ratio of the holes made for inter-level interconnects, where the aspect ratio refers the height of a hole as compared to its width. In general, the deeper the hole, the more difficult it is to fabricate the hole. Using the line of an underlying circuit, for example a bit line of a DRAM memory device, as a landing pad, the aspect ratio of the interconnection hole can be significantly reduced.

A typical multiple-layer DRAM memory device includes a cell region and a peripheral region. The cell region includes active switching devices, coupled to vertically-oriented capacitors, that serve as data storage devices. A cell bit line serves as an interconnect to transfer data between peripheral circuit regions and the cell region. The peripheral region includes a number of bit lines, that function as local interconnects, or studs, electrically coupling between the various active devices and transmission lines of the different layers. An insulative oxide layer is formed above the bit lines, and an interconnect stud is opened through the oxide layer and connected to the bit line.

When the bit lines are used for local interconnection, for example especially in sense amplifier regions, the layers of circuits can become very dense and crowded. For example, to access the bit line from an upper layer, the region between the bit lines must be accurately etched to form a stud interconnect hole; both in a lateral direction, so as to avoid contact with adjacent bit lines, and in a vertical direction, so as to ensure that the hole is formed at the proper depth. Because the peripheral region, for example a sense amplifier region of a DRAM device, is often times densely populated with various interconnect paths, the cross-sectional area of any vertical stud interconnects should be minimized. Therefore, the above case requires subsequent formation of high-aspect-ratio studs that are difficult to achieve using contemporary fabrication processes.

Contemporary techniques of forming the interconnect stud are subject to several process limitations. These include horizontal misalignment, in a lateral direction, where the stud hole may be laterally misaligned with the underlying bit line during formation of the stud hole. Vertical misalignment can also occur, wherein the stud hole is not etched deep enough, so the stud does not make contact with the underlying bit line, or wherein the stud hole is etched too deeply, and is etched through the bit line.

To improve alignment accuracy, U.S. Pat. No. 5,895,239 discloses a technique for employing a bit line landing pad together with a bit line stud. However, this approach requires tight tolerances at either, or both, the top portions of the bit lines, including the landing pad, and bottom portions of the upper interconnect stud, so as to provide a minimal width at the top of the bit line, and a maximum width at the bottom of the upper interconnect stud. A wide stud top limits circuit density considerations, while a narrow stud bottom leads to increased contact resistance and an increased aspect ratio that is difficult to accurately fabricate. No provision is made for vertical alignment of the stud, so if the stud hole is slightly misaligned with the underlying bit line, a void can be formed in the underlying inter-layer dielectric adjacent the stud.

Another approach at multiple-layered interconnect is disclosed in U.S. Pat. No. 5,891,799. With reference to FIG. 1, in this approach, an etch-stop layer 206, for example a silicon nitride masking layer ($Si_3N_4$) is formed over an inter-layer dielectric ($SiO_2$) 202, in turn formed over a metal layer 210 formed on a substrate 200. Stud holes 213A, 213B are patterned through the mask layer 206 and underlying dielectric layer 202 for the deposit of studs 212A, 212B to connect between the upper and lower layers. Once the studs 212A, 212B are formed, the masking layer 206 later serves as an etching reference for studs 214A, 214B formed through an upper masking layer 208 and upper dielectric layer 204. However, this technique suffers from a number of limitations. Since the Si$_3$N$_4$ masking layer 206, 208 is a high-stress-bearing material, and is formed indiscriminately as a layer over the entire circuit, this configuration imparts undue stress on the various layers, which may lead to warping of the circuit. Additionally, due to its high density, the masking layer prevents outgassing of impurities contained in the inter-layer dielectric, for example C, F, and Cl, during later high-temperature processes. The remaining Si$_3$N$_4$ masking layer would prevent the introduction of H$_2$ and O$_2$ during popular alloy processes, greatly affecting the conductive adhesiveness between the upper and lower metals.

Furthermore, this process is incompatible with contemporary memory fabrication processes, because the Si$_3$N$_4$ masking layer would be applied between bit lines. Dielectric spacers formed on each lateral side of a cell bit line prevent shorting between the cell bit line and the nearby capacitor. In order to make such spacers, it would be necessary to remove any masking layer between adjacent bit lines to allow for space for the capacitors to be inserted between the bit lines. However, this process would also remove any dielectric layer formed over the bit lines necessary for insulating the bit lines from the capacitors. This would also remove any masking layer on either side of the peripheral region bit lines, defeating the purpose of forming the masking layer in the first place.

SUMMARY OF THE INVENTION

The present invention is directed to a fabrication process and circuit that address the limitations of conventional techniques. For example, the present invention provides an etch-stop layer that is selectively patterned on only a portion of the underlying inter-layer dielectric, thereby allowing for outgassing during later fabrication processes. The remaining etch-stop layer is localized to only those portions surrounding the connecting media, for example surrounding the studs, between lower and upper contact holes. The surface area of the remaining etch-stop layer is preferably large enough so as to provide a suitable alignment target during formation of an overlying stud formed in an upper layer, yet small enough so as not to allow for sufficient outgassing, and so as to not interfere with neighboring contact holes, for example contact holes for nearby bit line landing pads.

In one aspect, the present invention is directed to a semiconductor device comprising a first dielectric layer formed on a substrate. A second dielectric layer is formed on the first dielectric layer. A stud is formed through the first and second dielectric layers, and a third dielectric layer is formed over a top of the stud. A first pad of first etch stop material is formed over the top surface of the stud and under the third dielectric layer.

The pad is preferably formed in a void region remaining after removal of a portion of the second dielectric layer. The third dielectric layer and the first etch stop material may comprise the same material.

The semiconductor device may further comprise a first circuit region formed in the first dielectric layer, the first circuit region including the stud; and a second circuit region formed in the first dielectric layer, the second circuit region including at least one conductive line and at least one spacer on a sidewall of the conductive line, the spacer being made of the same material as the first pad of the first etch stop material.

A second pad of a second etch stop material may be formed over the top surface of the stud and the first pad of the first etch stop material, the second pad of the second etch stop material being selectively patterned to cover only an area of the semiconductor device that includes the stud. The third dielectric layer, and the first and second etch stop materials may comprise the same material.

The semiconductor device may further include a first circuit region formed in the first dielectric layer, the first circuit region including the stud; and a second circuit region formed in the first dielectric layer, the second circuit region including at least one conductive line and at least one spacer on a sidewall of the conductive line, the spacer being made of the same material as the first pad of the first etch stop material, whereby the spacers and the first pad are formed simultaneously.

The third dielectric layer preferably has an etch selectivity with respect to the second dielectric layer, and may comprises etch stop material.

In another aspect, the present invention comprises a method of forming a semiconductor device. A first dielectric layer is formed on a substrate and a second dielectric layer is formed on the first dielectric layer. A stud is provided through the first and second dielectric layers, and a third dielectric layer is formed over the top of the stud and the second dielectric layer. A portion of the second dielectric layer is removed at the top of the stud, to create a void region in the second dielectric layer at the top of the stud and under the third dielectric layer. A first pad of a first etch stop material is provided in the void region.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 3A–3F are cutaway side views, the left and right columns being sectioned along orthogonal axes, illustrating use of an etch-stop pad formed in a void formed above a connecting stud for a multiple-layered memory device including cell and peripheral regions, in accordance with the present invention.

FIGS. 4A–4F are cutaway side views, the left and right columns being sectioned along orthogonal axes, illustrating use of an etch-stop pad formed in a void formed above a connecting stud for a multiple-layered memory device including cell and peripheral regions, in accordance with an alternative embodiment of the present invention.

DETAILED DESCRIPTION OF PREFERRED EMBODIMENTS

Throughout the detailed description, the principles of the present invention are illustrated in the context of a memory device having cell and peripheral regions. It will be apparent to those skilled in the art that the circuits and processes of the present invention disclosed herein are equally applicable to other multiple-layered circuit embodiments.

Figure 1:
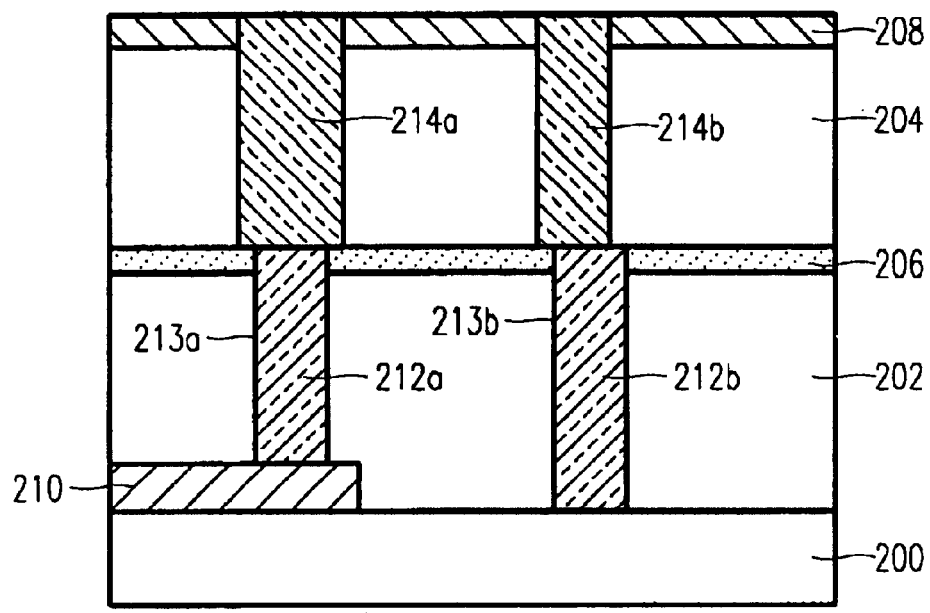
FIG. 1 is a cutaway side view of a conventional multiple-layered interconnect configuration, illustrating the use of a etch-stop layer.
Figure 2:
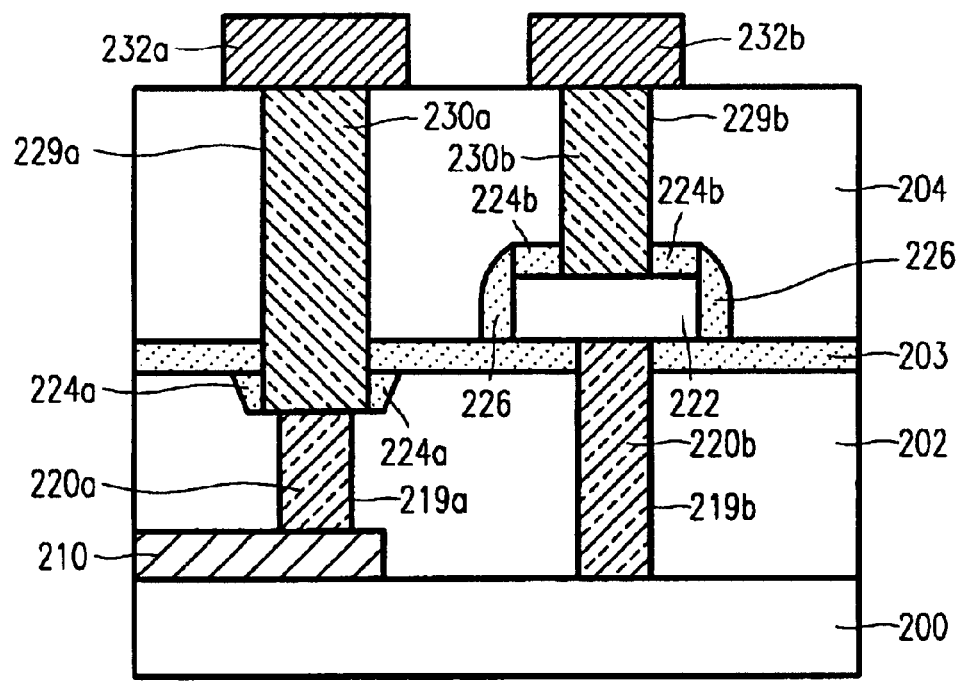
FIG. 2 is a cutaway side view of a multiple-layered interconnect configuration utilizing a selectively-patterned etch-stop layer, in accordance with the present invention.

FIG. 2 is a cutaway side view of a multiple-layered circuit configuration, in accordance with the present invention. A conductive layer pattern 210 is formed on a substrate 200. A first inter-layer dielectric 202 is provided over the conductive layer pattern. A second dielectric layer 203 is formed over the first 202. Contact holes 219A, 219B are formed in the inter-layer dielectric 202, and inter-layer contact studs 220A, 220B are provided in the contact holes 219A, 219B. A conductive line 222 is formed over one of the studs 220B, for example to later serve as a landing pad for an upper-level stud 230B.

A first etch-stop material layer 224A is selectively patterned on the upper surface of the lower-level stud 220A, and on a portion of the inter-layer dielectric 202 surrounding the lower-level stud 220A. The first etch-stop material layer 224B is further patterned on the conductive line 222. A second etch-stop material layer is patterned over the resulting structure, and selectively removed so as to provide for lateral spacers 226 on the side walls of the conductive line 222. The first and second etch-stop material layers 224A, 224B may comprise similar, or different, materials, for example $Si_3N_4$, $Ta_2O_5$ or $Al_2O_3$.

A second inter-layer dielectric 204 is formed over the resulting structure, and upper-level contact holes 229A, 229B are formed to provide for upper-level contact studs 230A, 230B. During formation of the holes 229A, 229B, the etch stop layers 224A, 224B serve as an alignment target to prevent over-etching of the underlying first inter-layer dielectric 202 in the region surrounding the stud 220A, and to prevent over-etching of the landing pad 222. Following formation of the upper-level studs 230A, 230B, metal traces 232A, 232B are provided on the resulting structure to complete the circuit.

An exemplary application of the configuration of the present invention will now be described with reference to FIGS. 3A–3F and FIGS. 4A–4F which illustrate sequential sectional views of the formation of inter-level contacts in a memory device including cell and peripheral regions, in accordance with the present invention. The "X" and "Y" direction views represent sections taken along respective orthogonal axes of the device, for example along the bit line and word line directions, respectively.

In FIG. 3A, an active memory cell 240 is formed in a substrate 200 of a memory device. The memory device includes a cell region 242 comprising densely-packed memory cells 240 and data lines, and a peripheral region 244, including interconnect lines, and peripheral circuitry, for example input/output circuitry, that service the memory cell region 242. Collectively, in the context of a memory device application, the data lines and peripheral interconnect lines are referred to herein as "bit lines". However, as explained above, the present invention is equally applicable to other embodiments requiring layer-to-layer interconnect.

A first dielectric layer 202, for example high-density-plasma oxide is formed on the cell region 242 and the peripheral region 244 and substrate 200. A second dielectric layer 302, is formed above the first dielectric layer. The second dielectric layer 302 may comprise, for example, a relatively low-dielectric-constant material having, for example, a faster etch rate as compared to the first dielectric layer 202, such as BPSG, TOSZ, PE-Oxide, SOG, or FOX. A first etch stop layer 304, comprising, for example silicon nitride $Si_3N_4$, is provided above the second dielectric layer.

Contact holes 219 are formed in the first etch stop layer 304 and first and second dielectric layers 202, 302, for example by etching, and contact studs 220A, 220B are provided in the holes 219, as shown in FIG. 3B. The contacts 220A, 220B are may be formed of tungsten, at a thickness of 500–2000 Angstroms. The gas reaction for deposition may comprise, for example:

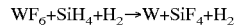

at 40 Torr, and 415 C. Typical n+/p+ contact resistance values are in the range of 300–1000 ohms per contact, assuming a 0.15 $\mu$m—wide bit line to an n+ contact, and 1.5–5 kilohms per contact for a 0.23 $\mu$m bit line to a p+ contact.

Assuming a tungsten plug, the plug 220A, 220B may be formed by first providing a titanium Ti layer, for example by chemical vapor deposition (CVD) to a thickness of 100 Angstroms. This is followed by providing a layer of TiN, for example by chemical vapor deposition or atomic layer deposition (ALD) to a thickness of 300 Angstroms; followed by a layer of tungsten (W) of approximately 2000 Angstroms in thickness. The resulting structure is polished by chemical-mechanical polishing or etch-back processes.

Assuming a titanium nitride TiN plug, the plug 220A, 220B may be formed by first providing a titanium Ti layer, for example by chemical vapor deposition (CVD) to a thickness of 100 Angstroms. This is followed by providing a layer of TiN, for example by chemical vapor deposition to a thickness of 1500 Angstroms; followed by a chemical-mechanical polishing process.

In FIG. 3C, a bit line metal layer 252, for example tungsten, and a bit line capping layer 258, also referred to herein as a second etch stop layer, for example $Si_3N_4$, are patterned over the studs 220B to be connected to bit lines. During patterning of the bit line material, a top portion of stud 220A is exposed, and therefore becomes partially etched to expose the second dielectric layer 302. Because the second dielectric layer 302 has a relatively fast etching rate, as compared to the first etch stop layer 304, a portion of the second dielectric layer 302 is removed below the first etch stop layer 304 through isotropic etching, undermining a circular ring under the first etch stop layer 304 about the upper surface of the stud 220A.

In FIG. 3D, a third etch-stop layer, for example comprising silicon nitride $Si_3N_4$, is applied to the resulting structure and removed so as to form lateral spacers on the lateral sides of the bit lines, and also filling the undermined region 308A with third etch-stop material and providing lateral spacers 308B on the walls of the undermined region, above the stud 208A. For purposes of the present invention, the resulting third etch-stop material filling the undermined regions is referred to herein as a "pad". To accomplish this, the third etch-stop layer is provided to a thickness of 200–700 Angstroms, preferably less than 500 Angstroms, and is isotropically etched to form the bit line spacers 306 and stud hole spacers 308B. The third etch stop layer may comprise $Si_3N_4$, $Ta_2O_5$ or $Al_2O_3$, depending on the application. The resulting thickness of the third dielectric layer material 308A in the undermined region is preferably approximately twice the lateral thickness of the sidewall spacers 306, 308B. For this reason, the thickness of the second inter-layer dielectric 302 is selected to match the resulting thickness of the dielectric layer.

Figure 3E:
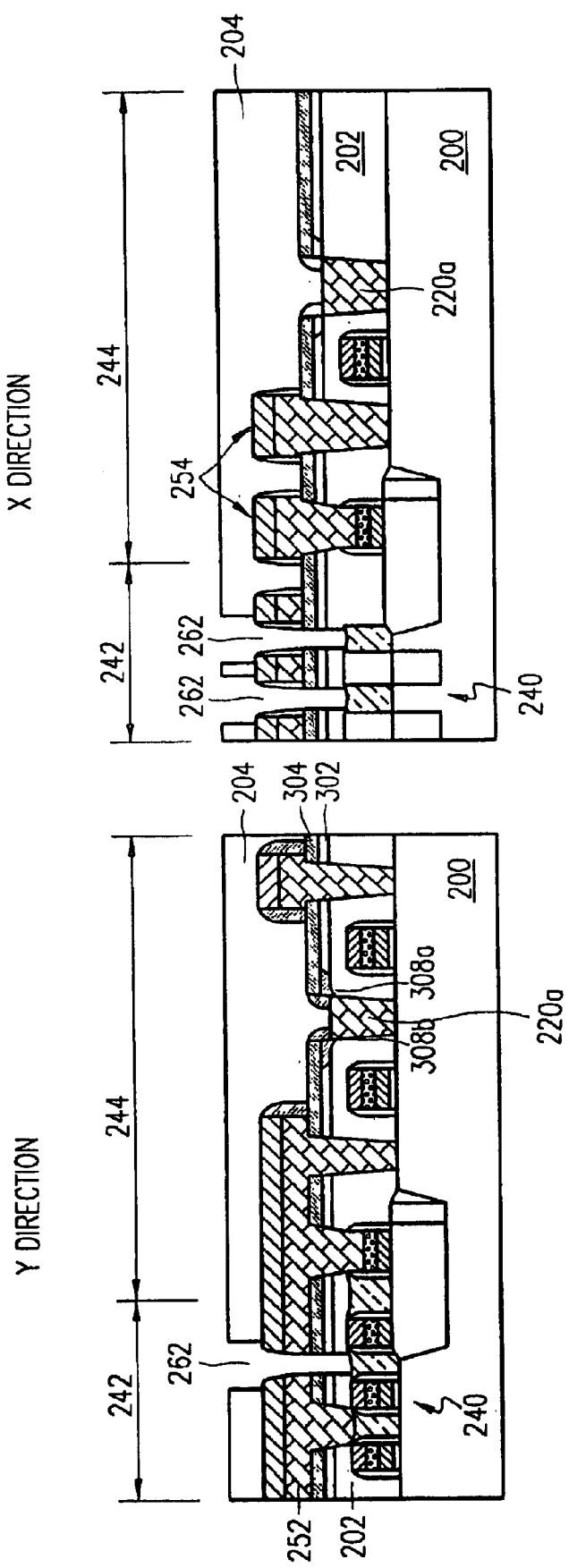

In FIG. 3E, a third inter-layer dielectric layer 204 is formed over the resulting structure and storage node contact holes 262 are formed according to conventional techniques.

Figure 3F:
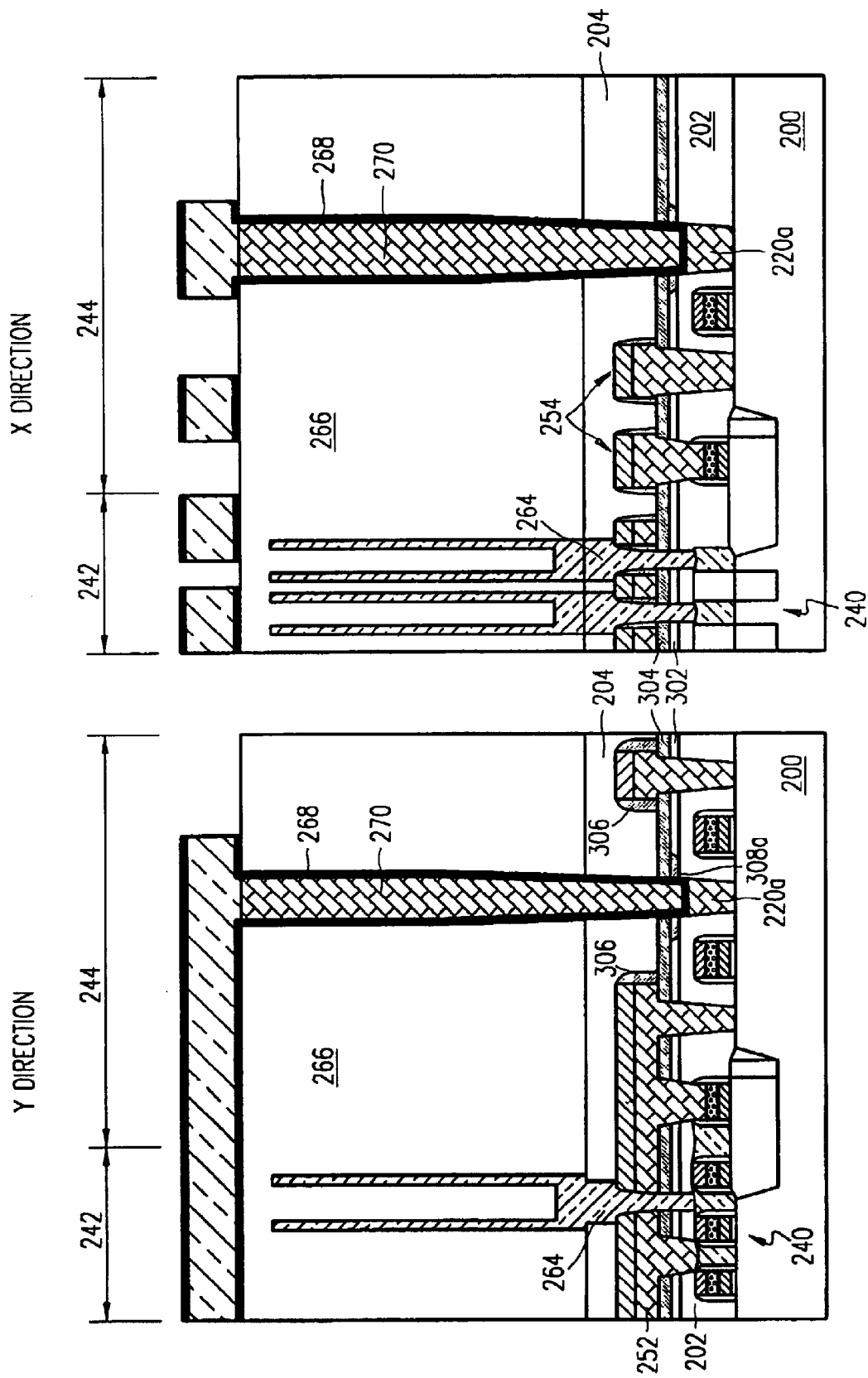

In FIG. 3F, the storage node contacts 264 are provided in the third inter-layer dielectric 204, and an fourth dielectric layer 266 is provided above the third 204. An upper-level contact hole 268 is provided in the dielectric layers 266, 204 using, for example, oxide etching, until the third etch-stop layer 308A, 308B becomes exposed. The third etch-stop layer 308A, 308B is used as a vertical guide for ensuring that the hole 268 properly exposes the top of the underlying stud 220A, without over-etching the underlying first inter-layer dielectric 202 at the sides of the underlying stud 220A in the stud coupling region. This is accomplished in a dual-step etching process that first etches through the third and fourth inter-layer dielectric layers 204, 266 comprising 1500 W, 40 mTorr, $C_4F_6+O_2+Ar$. Following this, etch-stop-layer attractive etching is performed using the underlying inter-layer dielectric 202 as an etch-stop to expose the top surface of the underlying stud 220A in a second etch process comprising 600 W, 50 mTorr, $CHF_3+Ar+H_2$, 105". For this reason, the third etch stop layer material 308A, 308B is preferably chosen to have different etching selectivity with respect to the underlying inter-layer dielectric 202.

In this manner, a connecting stud 220A is prepared for subsequent borderless contact formation. As a result, the circuit interconnection pattern can be accomplished in a relatively dense lateral configuration, for example in the dense configuration found in a peripheral region 244 of a semiconductor memory device.

To ensure proper vertical alignment and coupling of the lower and upper studs 270, 220A respectively, the third etch-stop layer 308A, 308B material is chosen so as to have a different etch selectivity as compared to that of the underlying first inter-layer dielectric insulating layer 202. In this manner, when forming upper stud hole 268, a first etch process can be used to accurately etch the third and second insulating dielectric layers 266, 204 to the upper surface of the first etch-stop layer 250. Following this, the first etch-stop material layer 250 is accurately etched in a second etch process to the upper surface of the underlying stud 220A.

Similar procedures are applicable simultaneously, or separately with the above process for providing inter-layer studs (not shown in the drawings) for coupling to other bit-lines of the peripheral region, for example bit lines including bit-line landing pads 254.

An advantage of the FIG. 3 embodiment of the present invention lies in that the undermined opening occurs naturally, and therefore it is not necessary to photolithographically align the etch-stop regions relative to the studs.

Figure 4A:
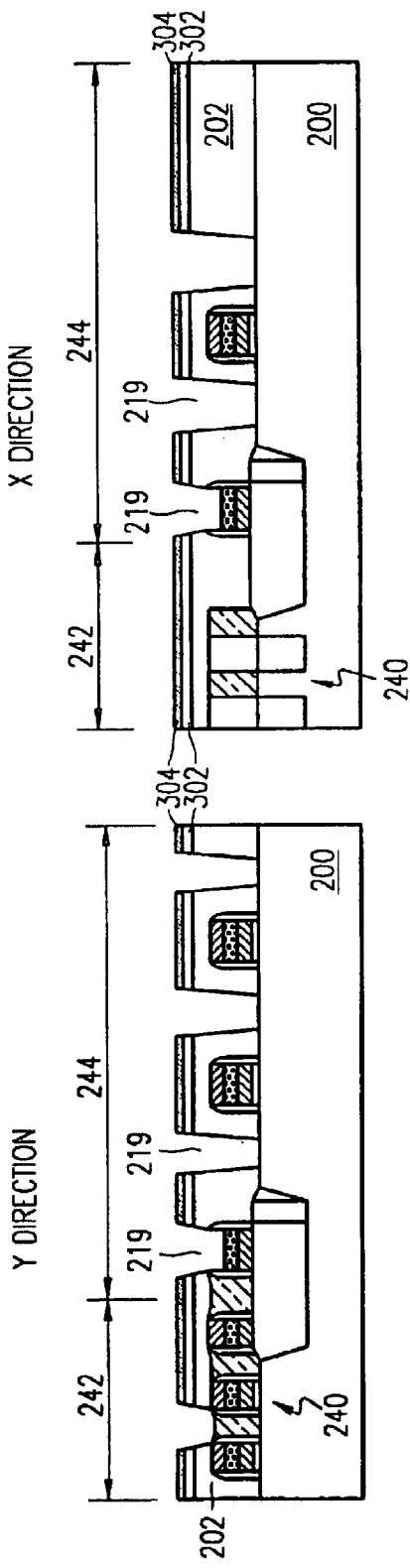
Figure 4B:
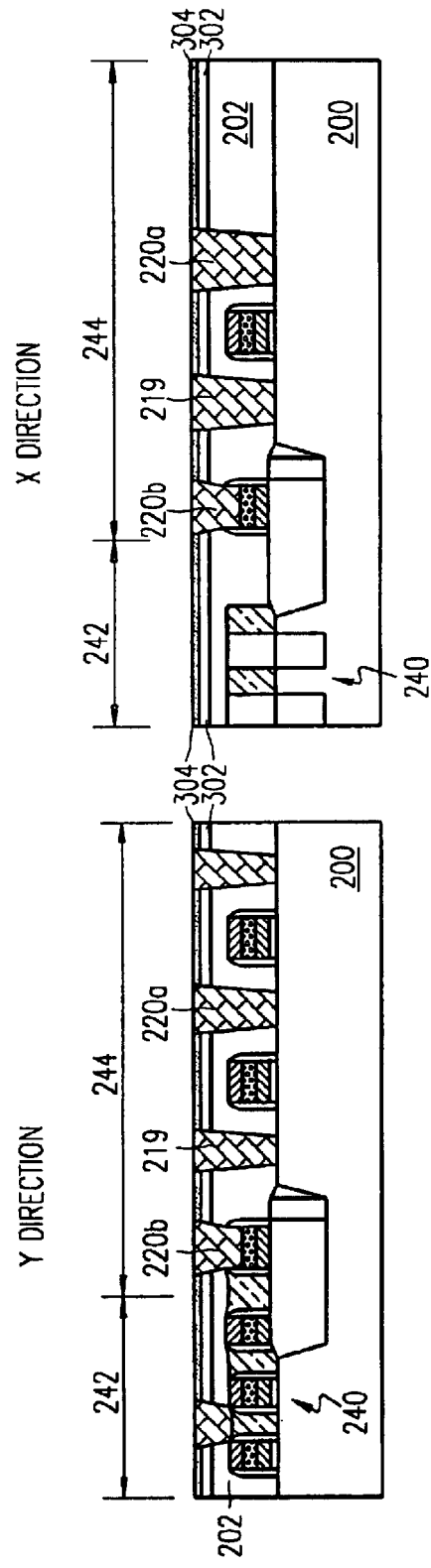
Figure 4E:
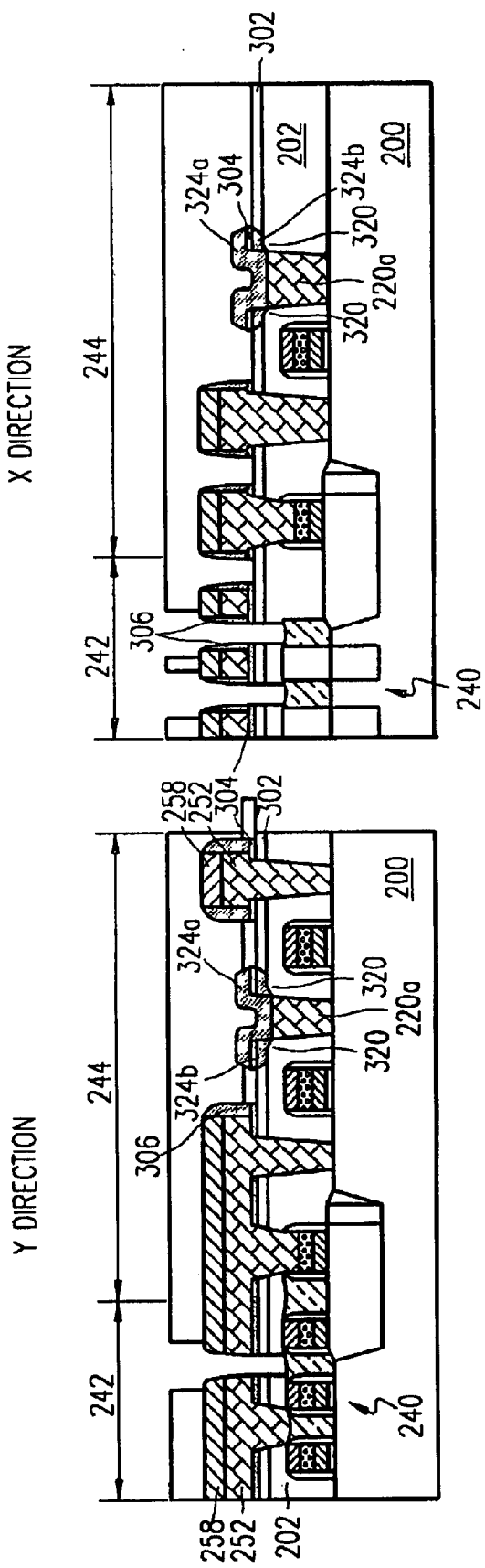
Figure 4F:
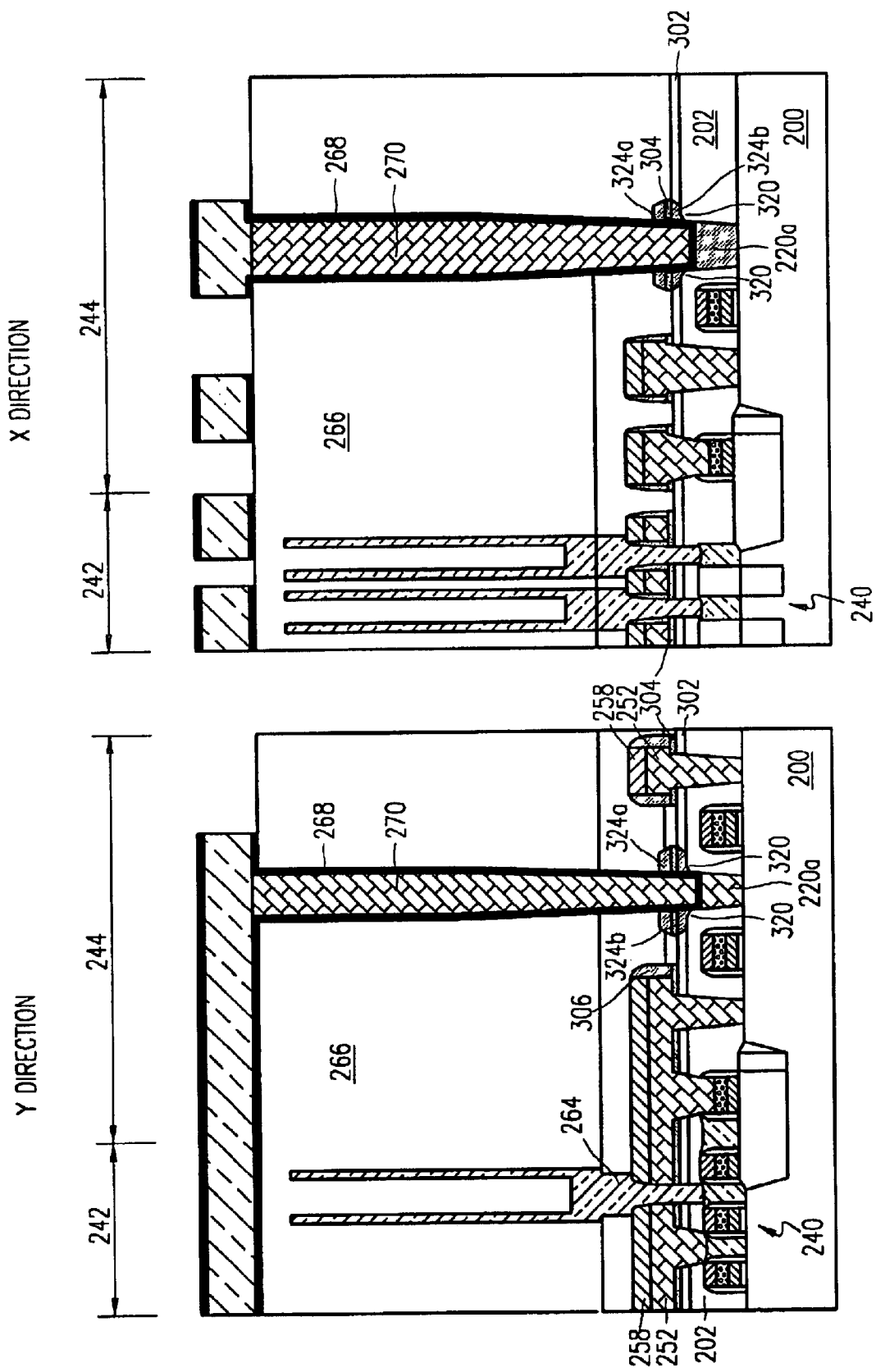

FIGS. 4A–4F illustrates an alternative embodiment of the present invention. In FIGS. 4A, 4B, and 4C, inter-level studs 220A, 220B are formed through second and first inter-layer dielectric layers 202, 302 and a first etch-stop layer 304 as described above with reference to FIGS. 3A–3C. An undermined region of the second dielectric layer 320 is likewise formed below the first etch-stop layer 304, as described above.

In FIG. 4D, following application of the third etch-stop layer for forming the bit line spacers 306, before removal of the applied third etch-stop layer, a mask 322 is provided over the opening above stud 220A, in order to prevent removal of the third etch stop layer in the region 324. For this reason, the additional third etch stop layer material, both above 324A, and below 324B, remains, while any etch stop layer material 304 between the stud region and the bit line regions is removed.

Following this, the third and fourth dielectric layers, capacitors, and contacts are provided, as described above, and as shown in FIGS. 4E and 4F. As explained above, the remaining third etch-stop layer is used as an etch stop during etching of the upper-level stud holes 270. The hole etching process is similar to the process described above with reference to FIG. 3.

Due to the presence of the etch stop layer pad 308, 324 in the region above the stud 220A in the embodiments of FIGS. 3 and 4, overetching, profile degradation, and resultant bad step coverage are avoided in the present invention. Accordingly, contact-induced bit failures are likewise reduced.

Additionally, since the etch stop layer pad 308, 324 is localized to the region of the top of the stud 220A, outgassing during subsequent processes, as well as related alloying issues, are considerably improved.

While this invention has been particularly shown and described with references to preferred embodiments thereof, it will be understood by those skilled in the art that various changes in form and details may be made herein without departing from the spirit and scope of the invention as defined by the appended claims.

For example, in an alternative embodiment, rather than a single metal deposition step, separate photolithographic processes may be employed to provide the metal contacts on the bit line patterns and the metal contact on the bit line stud.

We claim:

1. A semiconductor device comprising:

a first dielectric layer formed on a substrate;

a second dielectric layer formed on the first dielectric layer;

a stud formed through the first and second dielectric layers;

a third dielectric layer on the second dielectric layer having an opening above a top of the stud and being spaced apart from the stud; and a first pad of first etch stop material formed in an undermined region of the second dielectric layer below a portion of a lower surface of the third dielectric layer and above a portion of an upper surface of the first dielectric layer, the undermined region being formed after removal of a portion of the second dielectric layer.

2. The semiconductor device of claim 1 further comprising:

a first circuit region formed in the first dielectric layer, the first circuit region including the stud; and a second circuit region formed in the first dielectric layer, the second circuit region including at least one conductive line and at least one spacer on a sidewall of the conductive line, the spacer being made of the same material as the first pad of the first etch stop material.

3. The semiconductor device of claim 1 wherein the third dielectric layer and the first etch stop material are the same material.

4. The semiconductor device of claim 1 further comprising a second pad of a second etch stop material formed over the top surface of the stud and the first pad of the first etch stop material, the second pad of the second etch stop material being selectively patterned to cover only an area of the semiconductor device that includes the stud.

5. The semiconductor device of claim 4 wherein the third dielectric layer, and the first and second etch stop materials are the same material.

6. The semiconductor device of claim 1 further comprising:

a first circuit region formed in the first dielectric layer, the first circuit region including the stud; and a second circuit region formed in the first dielectric layer, the second circuit region including at least one conductive line and at least one spacer on a sidewall of the conductive line, the spacer being made of the same material as the first pad of the first etch stop material, whereby the spacers and the first pad are formed simultaneously.

7. The semiconductor device of claim 1 wherein the third dielectric layer has an etch selectivity with respect to the second dielectric layer.

8. The semiconductor device of claim 1 wherein the third dielectric layer comprises etch stop material.

9. The semiconductor device of claim 1 wherein the first pad further comprises stud hole spacers on a side wall of the opening in the third dielectric layer above the stud.

10. The semiconductor device of claim 9 wherein a lower portion of the stud hole spacers contact a perimeter of the top of the stud.

11. The semiconductor device of claim 9 wherein the stud hole spacers are formed of the first etch stop material.

* * * * *